(12) United States Patent
Liao

(10) Patent No.: US 8,836,144 B2
(45) Date of Patent: Sep. 16, 2014

(54) WAFER LEVEL PACKAGE STRUCTURE

(71) Applicant: Chipmos Technologies Inc., Hsinchu (TW)

(72) Inventor: Tsung Jen Liao, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 0 days.

(21) Appl. No.: 13/846,608

(22) Filed: Mar. 18, 2013

(65) Prior Publication Data

US 2014/0061899 A1 Mar. 6, 2014

(30) Foreign Application Priority Data

Aug. 31, 2012 (TW) .............................. 101131685 A

(51) Int. Cl.

| | |
|---|---|
| *H01L 23/48* | (2006.01) |
| *H01L 23/52* | (2006.01) |
| *H01L 29/40* | (2006.01) |
| *H01L 23/498* | (2006.01) |
| *H01L 23/00* | (2006.01) |
| *H01L 25/10* | (2006.01) |
| *H01L 25/065* | (2006.01) |

(52) U.S. Cl.
CPC .......... *H01L 23/49811* (2013.01); *H01L 24/03* (2013.01); *H01L 25/105* (2013.01); *H01L 25/0657* (2013.01); *H01L 25/065* (2013.01); *H01L 2225/1035* (2013.01); *H01L 2225/1052* (2013.01); *H01L 2225/1058* (2013.01); *H01L 2224/73277* (2013.01)
USPC .......................................... 257/777; 257/778

(58) Field of Classification Search
CPC .. H01L 25/065; H01L 25/0657; H01L 25/105
USPC .................................................. 257/777, 778
See application file for complete search history.

(56) References Cited

U.S. PATENT DOCUMENTS

| | | | |
|---|---|---|---|
| 2012/0061816 A1* | 3/2012 | Song et al. ..................... | 257/696 |
| 2012/0217644 A1* | 8/2012 | Pagaila ......................... | 257/774 |
| 2013/0093087 A1* | 4/2013 | Chau et al. .................... | 257/738 |

* cited by examiner

*Primary Examiner* — Phat X Cao
(74) *Attorney, Agent, or Firm* — WPAT, P. C.; Anthony King

(57) ABSTRACT

The present invention provides a semiconductor package structure, which includes a die, a plurality of bonding wires, an encapsulant, and a plurality of first external terminals. The die has an active surface and a back surface. A first end of each of the bonding wires is connected to the back surface of the die, and a second end opposite to the first end is electrically connected to the active surface of the die. The encapsulant covers the back surface of the die and the bonding wires, wherein a portion of each of the bonding wires is exposed from the encapsulant. The first external terminals are disposed on the top surface of the encapsulant, and cover the exposed portions of the bonding wires respectively and are electrically connected to the bonding wires.

13 Claims, 11 Drawing Sheets

WAFER LEVEL PACKAGE STRUCTURE

BACKGROUND OF THE INVENTION

1. Field of the Invention

The present invention is related to a wafer level package structure and the manufacturing method thereof, particularly related to a wafer level package structure for three dimensional stacking and the manufacturing method thereof.

2. Description of the Related Art

In order to meet the current requirements of portability and versatility on computer and consumer electronics products, the size hereof is required to be smaller and smaller while the integration density of integrated circuit chips becomes higher and higher. Due to the limitation of the available space, various packaging methods emerge, for example, the multi-chip module (MCM), flip chip package, three-dimensional (3D) stack package, and wafer level chip scale package (WLCSP). Basically, the concept of the wafer level packaging technology is that the chip scale packaging is executed on wafers. That is to say, during the wafer stage, most of the packaging work such as directly forming solder balls on an integrated circuit chip is completed, which not only omits the chip carrier such as a substrate or a lead frame in the conventional packaging technology, but also simplifies the packaging process. Therefore, the WLCSP can decrease the package size, and has considerable advantages regarding the process and the material costs.

In order to manufacture a semiconductor structure with higher integration density while not changing the form factor, it is inevitable that 3D packaging replaces two-dimensional (2D) packaging. Currently, the 3D stack package mostly uses a through-silicon-via (TSV) structure to achieve vertical electrical conduction, but the manufacturing costs and difficulty thereof are quite high. The present invention provides a special semiconductor package structure, in which repeated stacking is performed to achieve a 3D wafer level packaging.

In an improved wafer level package structure, fan-out wafer level package, a Redistribution Layer (RDL) extending out of a chip is formed on an active surface of the chip. The package structure only has a single surface capable of being arranged with solder balls to electrically connect to a printed circuit board; it thus cannot form a 3D die-to-die, 3D wafer-to-wafer, or 3D die-to-wafer stack structure.

Further, in the fan-out wafer level package, no carrier such as a substrate or a lead frame is used, and only an encapsulant is used to cover the chip, so that the structural strength thereof is insufficient. Moreover, the large difference in thermal expansion coefficient between the encapsulant and the chip is prone to induce warpage of the package which may further affect the reliability of the package structure.

In order to achieve a 3D stack wafer level package, the present invention provides a new structure and manufacturing method, so as to form the vertically conducted package structures at low cost and through a simplified process for further performing vertical stacking of semiconductor structures.

SUMMARY

One embodiment of the present invention discloses a semiconductor package structure, said package structure includes a die, a plurality of bonding wires, an encapsulant, and a plurality of first external connection terminals. The die includes an active surface and a back surface opposite to the active surface. The first end of each of the bonding wires is connected to the back surface of the die, and a second end opposite to the first end is electrically connected to the active surface. The encapsulant covers the back surface of the die and the bonding wires, wherein a portion of each of the bonding wires is exposed from the encapsulant. The plurality of first external connection terminals are disposed on the encapsulant, respectively cover the portions of the bonding wires exposed from the encapsulant, and are electrically connected to the bonding wires. According to another embodiment of the present invention, the semiconductor package structure described above further includes at least one recessed structure formed in the encapsulant to accommodate the first external connection terminals. According to another embodiment of the present invention, the semiconductor package structure described above further includes a plurality of conductive pads connected to the second ends of the bonding wires respectively.

Another embodiment of the present invention discloses a semiconductor stack structure, which includes at least two semiconductor package structures being stacked together. The semiconductor package structure includes a die, a plurality of bonding wires, an encapsulant, and a plurality of first external connection terminals. The die includes an active surface and a back surface opposite to the active surface. The first end of each of the bonding wires is connected to the back surface of the die, and a second end opposite to the first end is electrically connected to the active surface. The encapsulant covers the back surface of the die and the bonding wires, wherein a portion of each of the bonding wires is exposed from the encapsulant. The plurality of first external connection terminals are disposed on the encapsulant, respectively cover the portions of the bonding wires exposed from the encapsulant, and are electrically connected to the bonding wires. The semiconductor package structures are electrically connected to each other by the first external connection terminals, so as to form the semiconductor stack structure.

The semiconductor package structure disclosed in one embodiment of the present invention is manufactured by the following method: providing a carrier plate; disposing a die on the carrier plate, wherein the die comprises an active surface and a back surface opposite to the active surface, and the active surface is attached to the carrier plate; forming a plurality of bonding wires, wherein each of the bonding wires has a first end and a second end opposite to the first end, the first end is connected to the back surface of the die, and the second end is connected to the carrier plate; forming an encapsulant covering the die and the bonding wires, wherein a portion of each of the bonding wires is exposed from the encapsulant; removing the carrier plate; electrically connecting the second ends of the bonding wires to the active surface of the die; and forming a plurality of first external connection terminals on the encapsulant, wherein the first external connection terminals respectively cover the portions of the bonding wires exposed from the encapsulant, and are electrically connected to the bonding wires.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which:

FIG. 8-1 to FIG. 8-6 show the steps of a method for manufacturing a semiconductor package structure according to one embodiment of the present invention;

FIG. 10-1 to FIG. 10-6 show the steps of a method for manufacturing a semiconductor package structure according to one embodiment of the present invention.

PREFERRED EMBODIMENT OF THE PRESENT INVENTION

Figure 1:
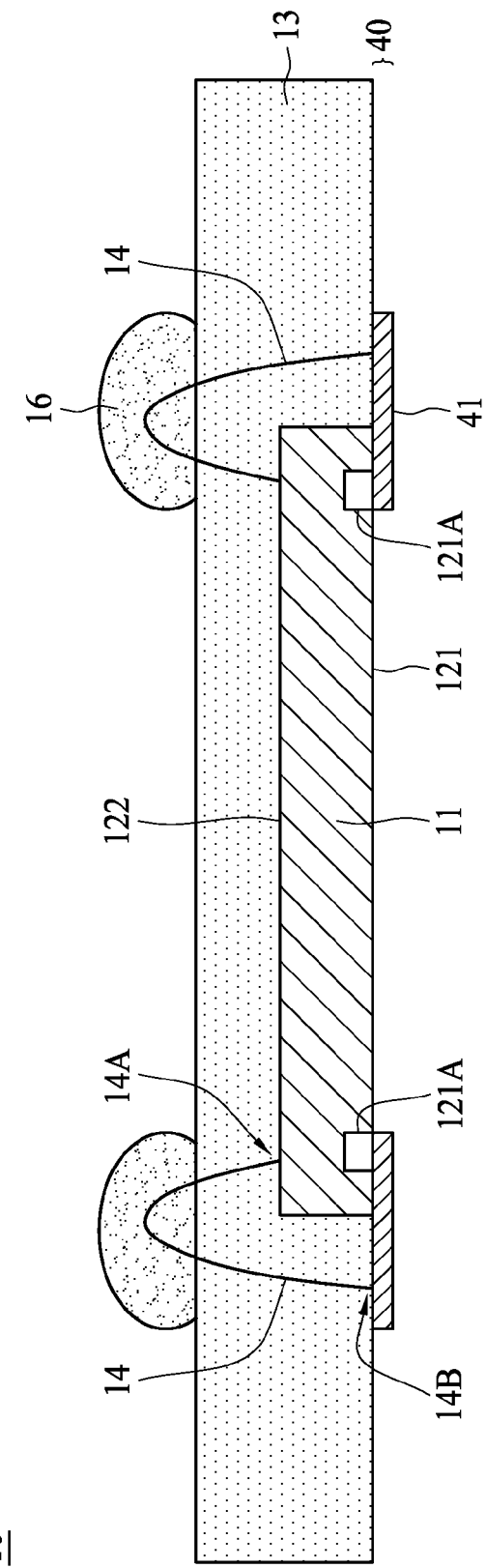
FIG. 1 shows a semiconductor package structure according to one embodiment of the present invention.

FIG. 1 is a semiconductor package structure 10 according to an embodiment of the present invention. The structure 10 includes a die 11, a plurality of bonding wires 14, an encapsulant 13, and a plurality of first external connection terminals 16. The first external connection terminals 16 may be solder balls. The die 11 includes an active surface 121 and a back surface 122 opposite to the active surface 121. The active surface 121 has a plurality of bond pads 121A. A first end 14A of the bonding wire 14 is connected to the back surface 122 of the die 11. In this embodiment, the material of the bonding wires 14 may be copper, silver, palladium, gold, or their alloys. The bonding wires 14 are formed by the conventional wire bonding technique, and the bonding wires 14 are in an arc shaped. The encapsulant 13 covers the back surface 122 of the die 11 and the bonding wires 14. Each of the bonding wires 14 is not completely covered by the encapsulant 13 and thus with a portion exposed from the encapsulant 13. Specifically, the portion of the bonding wire 14 exposed from the encapsulant 13 is the top portion of the arc. The first external connection terminals 16 are disposed on the encapsulant 13, and respectively placed on the exposed portions of the bonding wires 14 correspondingly to cover and electrically connect to the bonding wires 14. In this embodiment, a second end 14B, opposite to the first end 14A, of each of the bonding wires 14 is electrically connected to the active surface 121 of the die 11 by a patterned conductive layer 40. Specifically, the patterned conductive layer 40 includes a plurality of conductive traces 41. Each of the conductive traces 41 is electrically connected to the second end 14B of the bonding wire 14 and the bond pad 121A on the active surface 121 respectively. In the semiconductor package structure 10, the bonding wires 14 are electrically connected to the first external connection terminals 16 on the back surface 122 and the active surface 121 of the die 11 respectively to form a vertically electrically conducted package structure for further performing vertical stacking of the semiconductor package structures.

Figure 2:
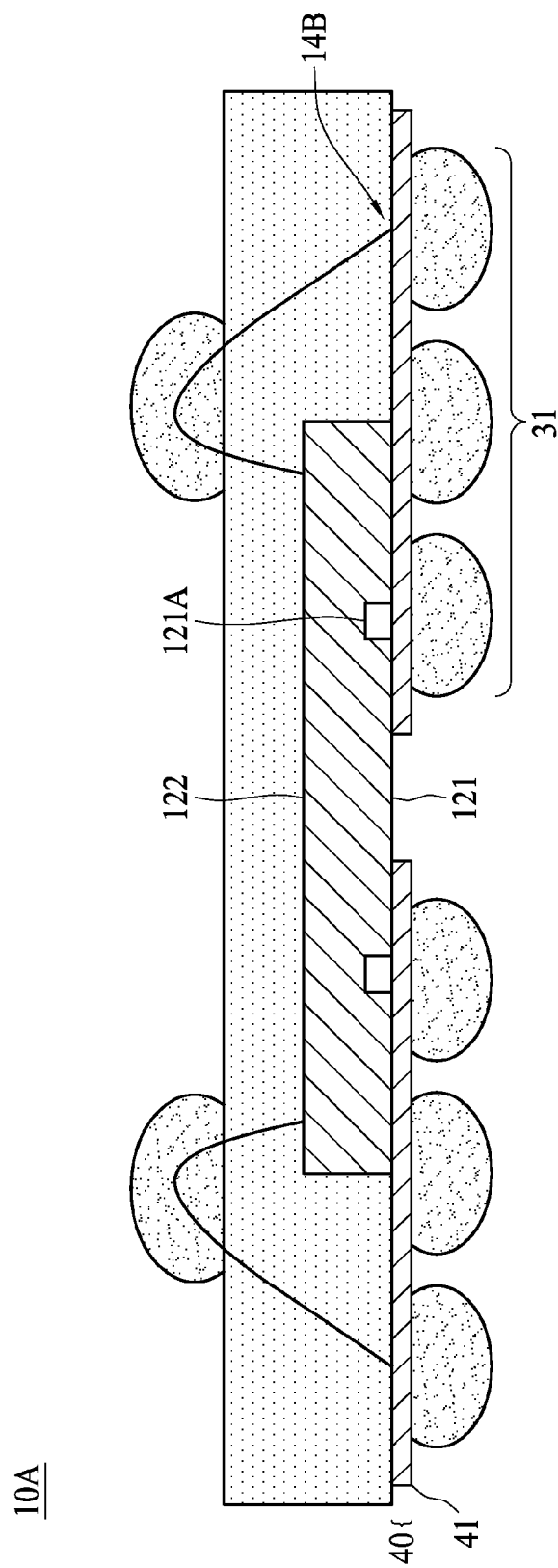
FIG. 2 shows a semiconductor package structure according to one embodiment of the present invention.

FIG. 2 is a semiconductor package structure 10A according to another embodiment of the present invention. In addition to the features of the semiconductor package structure 10 in FIG. 1, this embodiment further has a plurality of second external connection terminals 31 electrically connected to the patterned conductive layer 40 which includes a plurality of conductive traces 41 in this embodiment. The semiconductor package structure 10A may be connected to a printed circuit board (not shown) or another semiconductor package structure (not shown) by the second external connection terminals 31. The second external connection terminals 31 may be solder balls.

Figure 3:
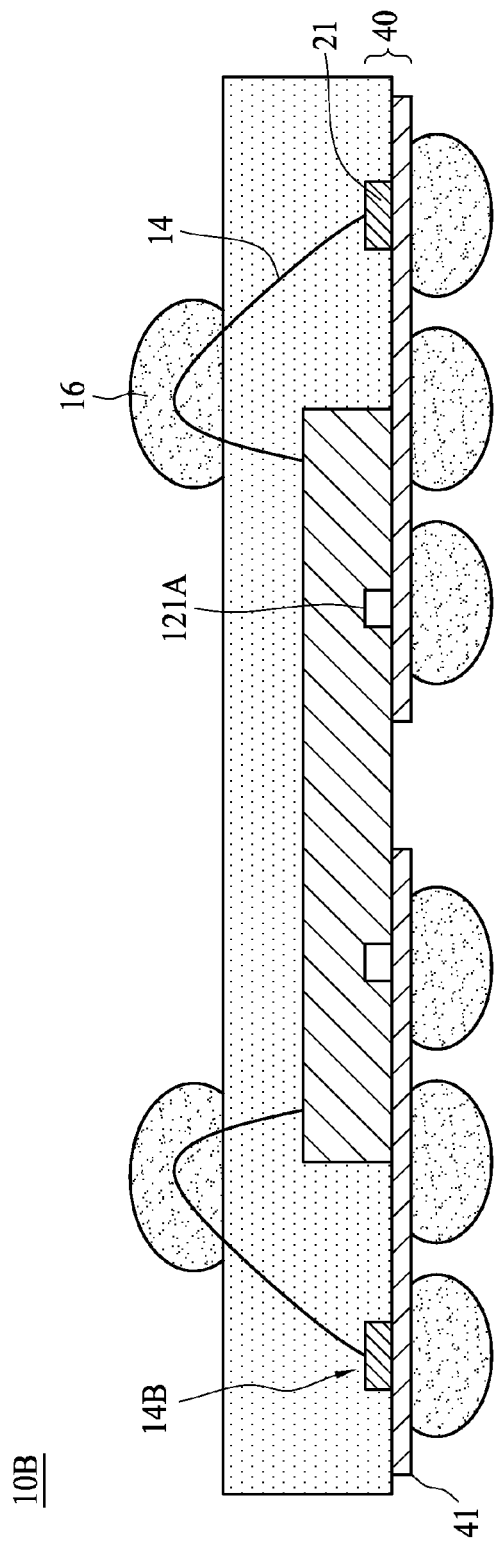
FIG. 3 shows a semiconductor package structure according to one embodiment of the present invention.

FIG. 3 is a semiconductor package structure 10B according to another embodiment of the present invention. In this embodiment, in addition to the features of the semiconductor package structure 10A in FIG. 2, the patterned conductive layer 40 further includes a plurality of conductive pads 21 disposed on the conductive traces 41 respectively. The second ends 14B of the bonding wires 14 are connected to the conductive pads 21. The conductive pads 21 facilitate the bonding between the bonding wires 14 and the patterned conductive layer 40 and the alignment during a wire bonding process.

Figure 4:
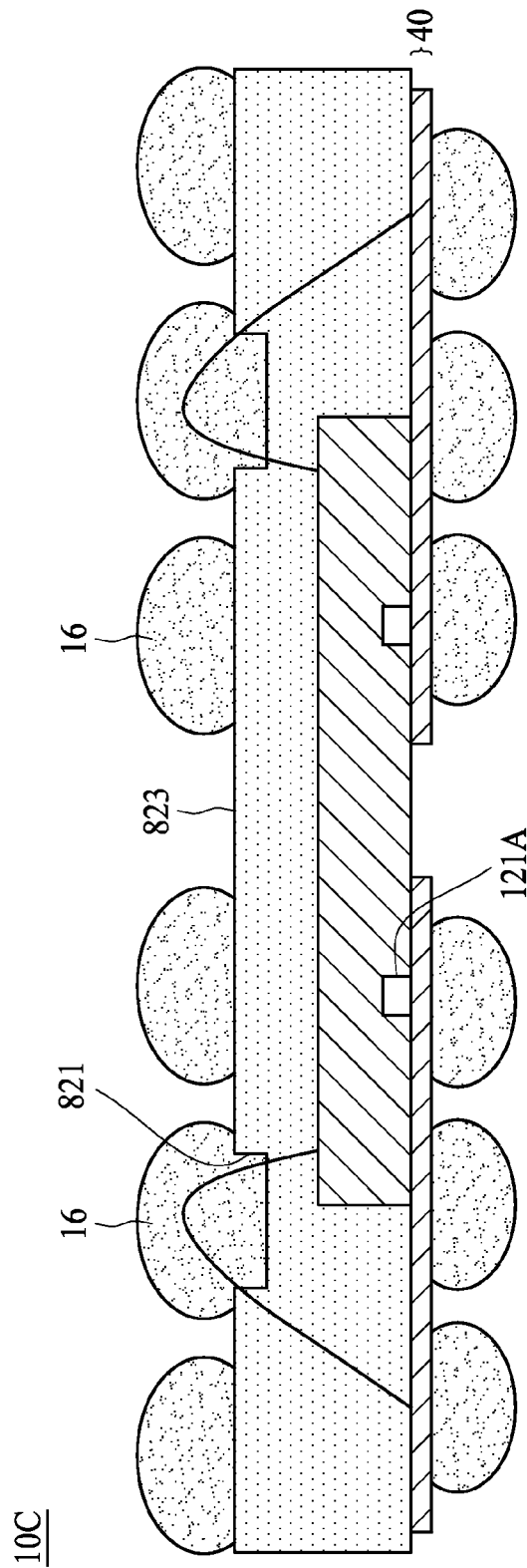
FIG. 4 shows a semiconductor package structure according to one embodiment of the present invention.

FIG. 4 is a semiconductor package structure 10C according to another embodiment of the present invention. In this embodiment, in addition to the features of the semiconductor package structure 10A in FIG. 2, at least one recessed structure 821 is formed on an upper surface 823 of the encapsulant 13. The recessed structure 821 is disposed corresponding to the position of the bonding wire 14 to accommodate the first external connection terminal 16, so that the first external connection terminal 16 covers the portion of the bonding wire 14 exposed from the encapsulant 13, and is electrically connected to the bonding wire 14. In the semiconductor package structure 10C, the bonding wire 14 may also be partially exposed from the encapsulant 13 through the recessed structure 821. The number of the recessed structure 821 may be greater than or equal to 1. The recessed structure 821 is not limited to any particular shape, and may include multiple pits each corresponding to a single external connection terminal 16 respectively, or a rectangular groove or a ring-shaped groove corresponding to multiple external connection terminals 16. This embodiment does not limit that the first external connection terminals 16 are disposed in the recessed structure 821, but may further include a plurality of first external connection terminals 16 placed on the upper surface 823 of the encapsulant 13.

Figure 5:
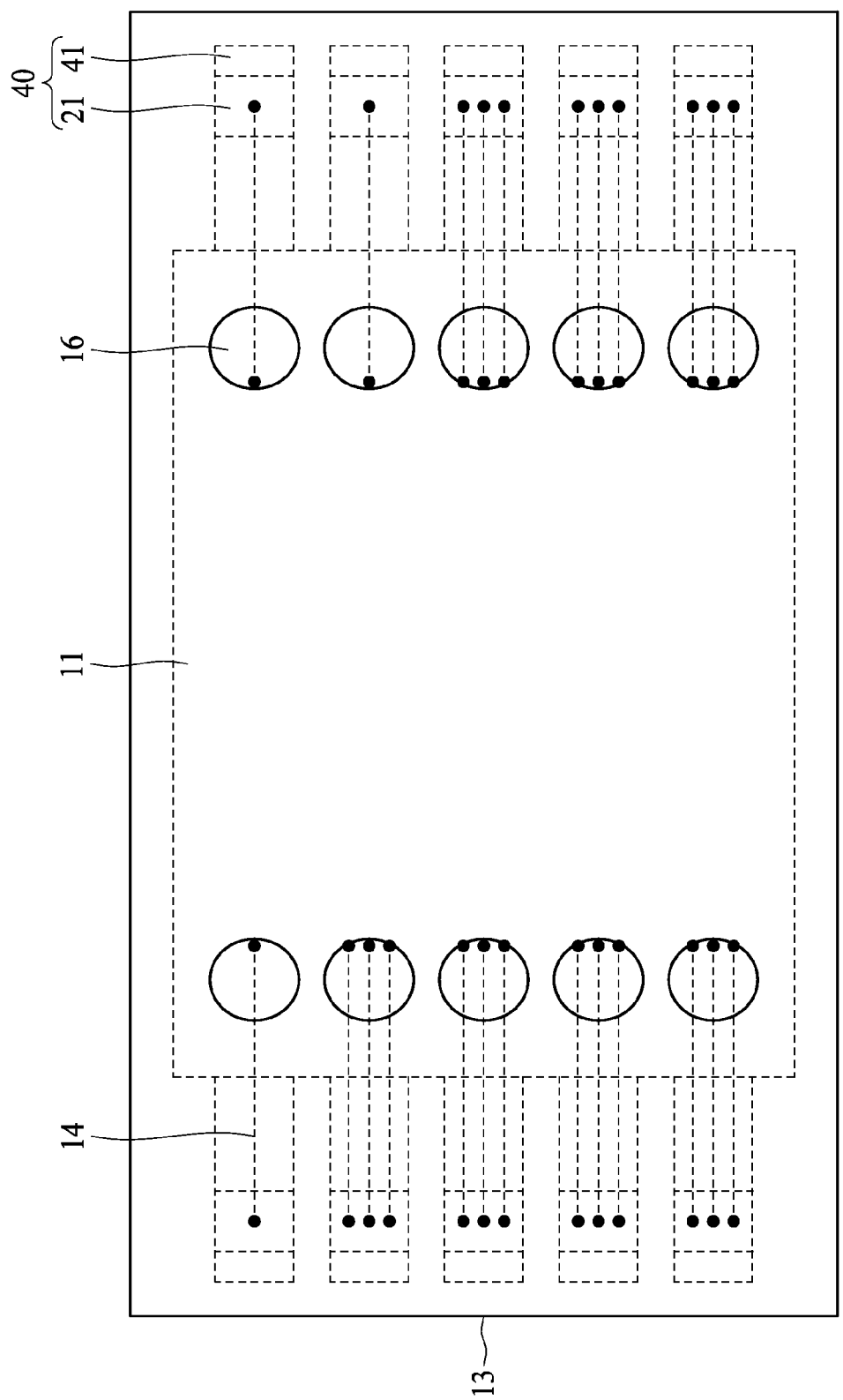
FIG. 5 is a top view illustrating the electrical connection between the die and the patterned conductive layer of a semiconductor package structure shown in FIG. 1 or FIG. 3.

FIG. 5 is a top view illustrating a die 11 electrically connected to a patterned conductive layer 40 in a semiconductor package structure according to the embodiment of FIG. 1 or FIG. 3 of the present invention. Referring to FIG. 1 or FIG. 3, the patterned conductive layer 40 includes a plurality of conductive traces 41. Each of the conductive traces 41 has one end electrically connected to the bond pad 121A on the active surface 121 of the die 11, and the other end extending out of the die 11. The bonding wires 14 are connected to the back surface 122 of the die 11 and the conductive traces 41 respectively. The first external connection terminals 16 are disposed on the encapsulant 13, and respectively cover the portions of the bonding wires 14 not covered by the encapsulant 13 so as to be electrically connected to the bonding wires 14. Preferably, as shown in FIG. 3, there may be the conductive pads 21 disposed on the conductive traces 41 so that the bonding wires 14 are connected to the back surface 122 of the die 11 and the conductive pads 21. The conductive pads 21 facilitate the alignment in a wire bonding process and the bonding between the bonding wires 14 and the patterned conductive layer 40. In this embodiment, the number of the bonding wire(s) 14 electrically connected to a single first external connection terminal 16 and a single conductive trace 41/conductive pad 21 may be one or plural. Connecting a single first external connection terminal 16 and a single conductive trace 41/conductive pad 21 with a plurality of the bonding wires 14 can ensure the integrity of the electrical connection.

Figure 6:
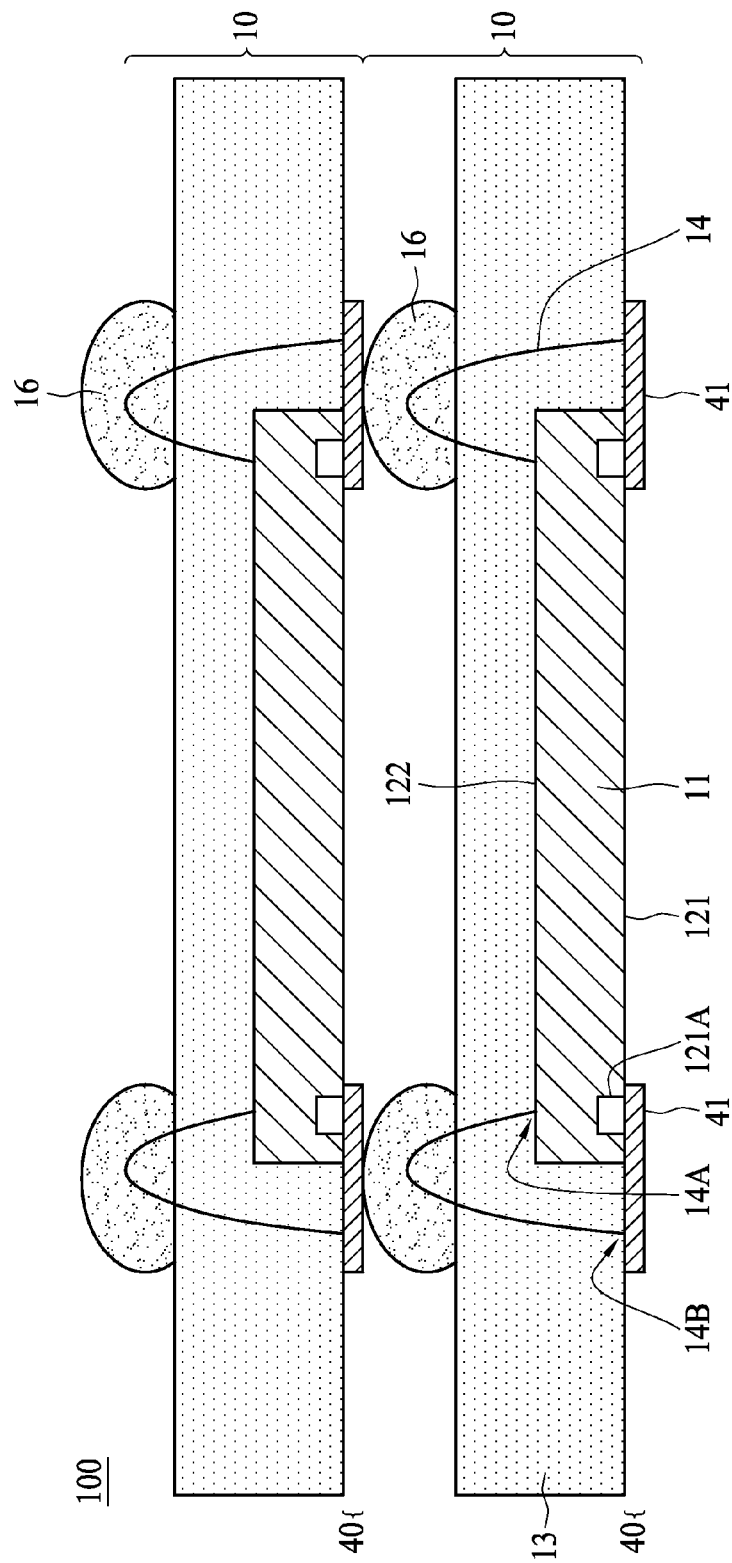
FIG. 6 shows a semiconductor stack structure according to one embodiment of the present invention.

FIG. 6 is a semiconductor stack structure 100 according to another embodiment of the present invention. The stack structure 100 includes at least two semiconductor package structures 10 vertically stacked together, wherein the semiconductor package structure 10 includes a die 11, a plurality of bonding wires 14, an encapsulant 13, and a plurality of first external connection terminals 16. The die 11 includes an active surface 121 and a back surface 122 opposite to the active surface 121. The active surface 121 has a plurality of bond pads 121A disposed thereon. A first end 14A of the bonding wire 14 is connected to the back surface 122 of the die 11. The encapsulant 13 covers the back surface 122 of the die 11 and the bonding wires 14. Each of the bonding wires 14 is not completely covered by the encapsulant 13 and thus with a portion exposed from the encapsulant 13. The first external connection terminals 16 are disposed on the encapsulant 13, and respectively placed on the exposed portions of the bonding wires 14 correspondingly to cover and electrically connect to the bonding wires 14. In this embodiment, a second end 14B, opposite to the first end 14A, of each of the bonding wires 14 is electrically connected to the active surface 121 of the die 11 by a patterned conductive layer 40. Specifically, the patterned conductive layer 40 includes a plurality of conductive traces 41. Each of the conductive traces 41 is electrically connected to the second end 14B of the bonding wire 14 and the bond pad 121A on the active surface 121 respectively. In the semiconductor package structure 10, the bonding wires 14 are electrically connected to the first external connection terminals 16 on the back surface 122 and the active surface 121 of the die 11 respectively to form a vertically electrically conducted package structure. Therefore, the semiconductor package structure 10 may be electrically connected to another semiconductor package structure 10 through the first external connection terminals 16 to form the semiconductor stack structure 100. Although the two semiconductor package structures 10 in the embodiment of FIG. 6 are of the same structure, the scope of the present invention is not limited thereto. Any two semiconductor package structures may be the same or different, and may be selected from the structures shown in FIG. 2, FIG. 3 and FIG. 4 or any combination thereof.

Figure 7:
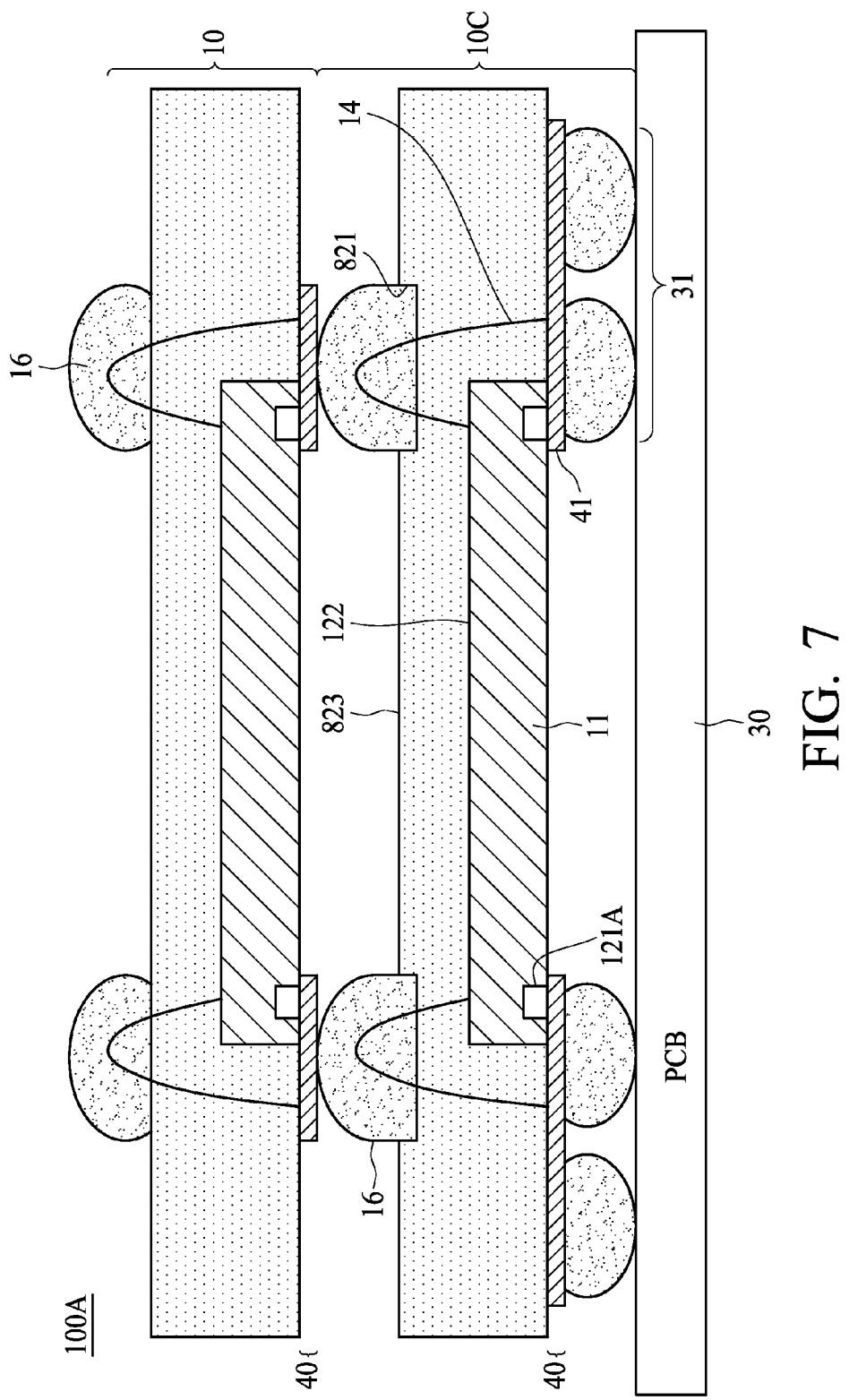
FIG. 7 shows a semiconductor stack structure according to one embodiment of the present invention.

FIG. 7 is a semiconductor stack structure 100A according to another embodiment of the present invention. In this embodiment, in addition to the features of the semiconductor stack structure 100 in FIG. 6, the semiconductor package structure 10C further has a plurality of second external connection terminals 31 electrically connected to the conductive traces 41. Therefore, the semiconductor stack structure 100A may be connected to a printed circuit board 30 or other external devices (not shown) by the second external connection terminals 31.

Figures 1, 8:
Figures 2, 8:
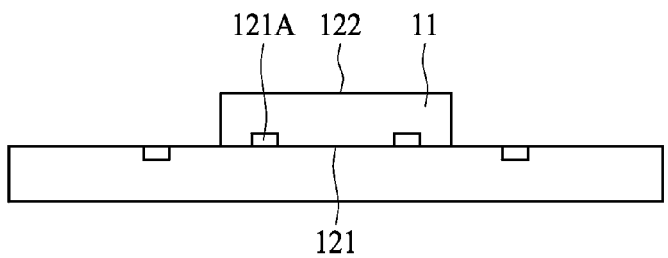
Figures 3, 8:
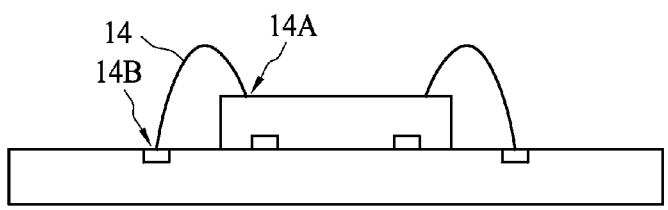
Figures 4, 8:
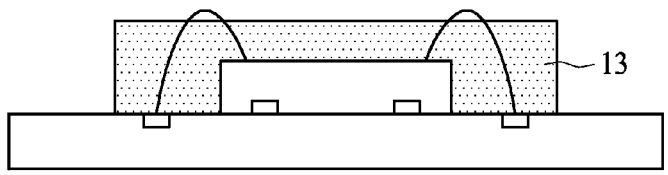
Figures 5, 8:
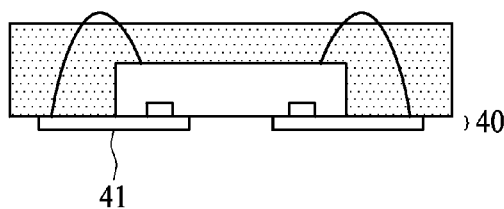
Figures 6, 8:
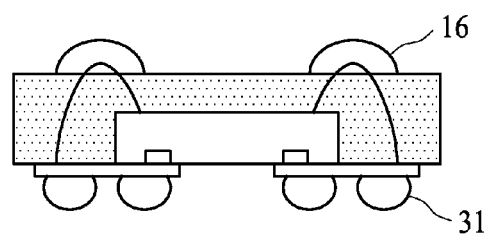

FIG. 8-1 to FIG. 8-6 show the manufacturing steps of a semiconductor package structure according to another embodiment of the present invention. Referring to FIG. 8-1, a carrier plate 80 is provided first. An upper surface of the bearing plate 80 has a plurality of contact points 80A. Referring to FIG. 8-2, a die 11 is disposed on the carrier plate 80. The die 11 includes an active surface 121 and a back surface 122 opposite to the active surface 121. The active surface 121 has a plurality of bond pads 121A. The die 11 is attached to the carrier plate 80 through the active surface 121. Referring to FIG. 8-3, a plurality of bonding wires 14 is formed by the conventional wire bonding process. The material of the bonding wires 14 may be copper, silver, palladium, gold, or an alloy thereof. The bonding wires 14 each have a first end 14A and a second end 14B. The first end 14A is connected to the back surface 122 of the die 11, and the second end 14B is connected to the contact point 80A. Referring to 8-4, an encapsulant 13 is formed to cover the die 11 and the bonding wires 14. Each of the bonding wires 14 is not completely covered by the encapsulant 13 and thus with a portion exposed from the encapsulant 13. In this embodiment, to make the bonding wires 14 be partially exposed from the encapsulant 13, the encapsulant 13 may completely cover the die 11 and the bonding wires 14 first, and then an etching step is applied to remove a surface of the encapsulant 13 until the bonding wires 14 are partially exposed.

Referring to 8-5, the carrier plate 80 is then removed so that the second ends 14B of the bonding wires 14 are exposed from the encapsulant 13. A patterned conductive layer 40 which includes a plurality of conductive traces 41 in this embodiment is formed on the active surface 121 of the die 11 and a lower surface of the encapsulant 13 to have the second ends 14B of the bonding wires 14 being electrically connected to the bond pads 121A on the active surface 121 of the die 11. Referring to 8-6, first external connection terminals 16 are formed on the encapsulant 13 and electrically connected to the portions of the bonding wires 14 exposed from the encapsulant 13 respectively. In this embodiment, the first external connection terminals 16 may be solder balls, and this step may be a ball planting step with a ball planting method selected from but not limited to, for example, screen printing, vapor deposition, electroplating, ball drop, and ball spraying. Furthermore, in this embodiment, a plurality of second external connection terminals 31 electrically connected to the conductive traces 41 respectively may be formed optionally.

Figure 9A:
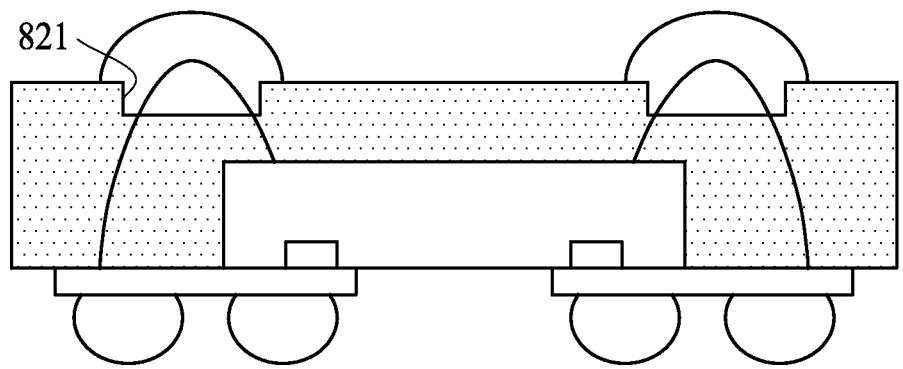
FIG. 9A and FIG. 9B show two semiconductor package structures according to two embodiments of the present invention.
Figure 9B:
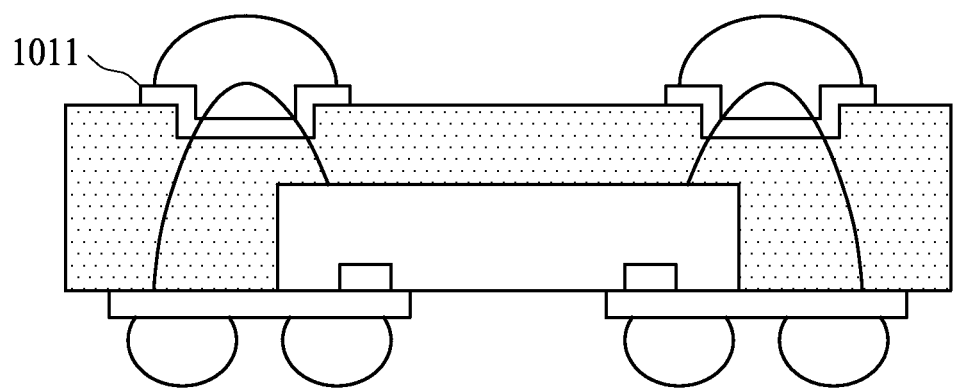

FIG. 9A and FIG. 9B show two semiconductor package structures according to another embodiments of the present invention. Compared with FIG. 8-6, FIG. 9A further includes a step of forming at least one recessed structure 821 on an upper surface of the encapsulant 13. The recessed structure 821 corresponds to the portions of the bonding wires 14 exposed from the encapsulant 13, and is used to accommodate the first external connection terminals 16, thereby facilitating the positioning and the attachment of the first external connection terminals 16. The recessed structure 821 may be formed through an etching step, which is, but not limited to, for example an etching step using a carbon dioxide laser. Since the carbon dioxide laser only removes the encapsulant, but does not remove metal, the etching step can ensure that the metal bonding wires 14 are not damaged. Compared with FIG. 9A, FIG. 9B further includes forming an under bump metallization (UBM) 1011 in the recessed structure 821. The UBM 1011 is located between the first external connection terminals 16 and the upper surface of the encapsulant 13, so as to reinforce the bonding between the first external connection terminals 16 and the encapsulant 13. Furthermore, the UBM 1011 of metal material being formed on the upper surface of the encapsulant 13 makes the upper and lower surfaces of the encapsulant 13 both overlaid by the metal structures, thereby alleviating the warpage problem of the package structure.

Figures 1, 10:
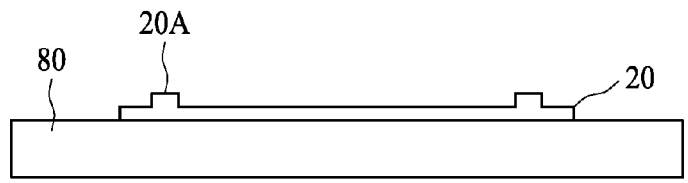
Figures 2, 10:
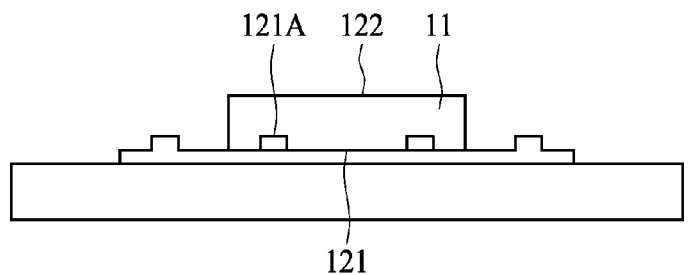
Figures 3, 10:
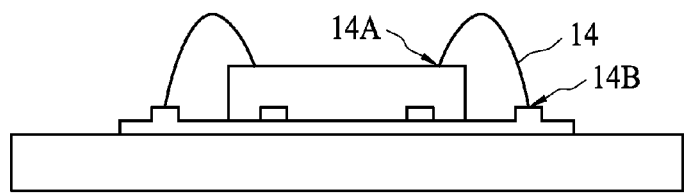
Figures 4, 10:
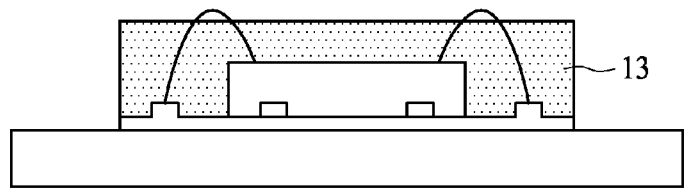
Figures 5, 10:
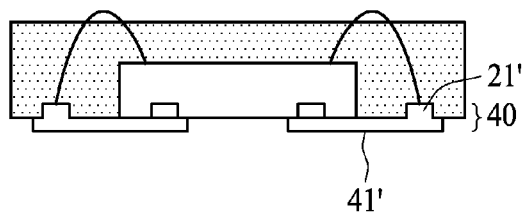
Figures 6, 10:
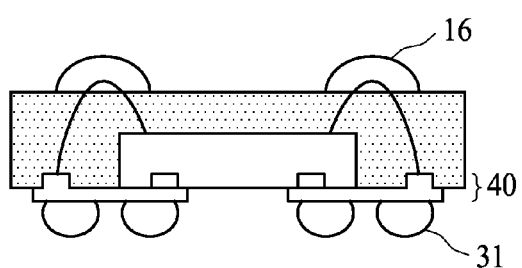

FIG. 10-1 to FIG. 10-6 show the manufacturing steps of a semiconductor package structure according to another embodiment of the present invention. Referring to FIG. 10-1, a carrier plate 80 is provided first. A metal layer 20 having a plurality of protruding portions 20A is disposed on the carrier plate 80. In this embodiment, the protruding portions 20A may be formed by etching a metal layer of a copper film in a uniform thickness. Referring to FIG. 10-2, a die 11 is disposed on the metal layer 20. The die 11 includes an active surface 121 and a back surface 122 opposite to the active surface 121. The active surface 121 has bond pads 121A. The die 11 is attached to the metal layer 20 with the active surface 121. Referring to FIG. 10-3, a plurality of bonding wires 14 is formed by the conventional wire bonding process. The material of the bonding wires 14 may be copper, silver, palladium, gold, or an alloy thereof. The bonding wires 14 each have a first end 14A and a second end 14B. The first ends 14A are connected to the back surface 122 of the die 11. The second ends 14B are connected to the protruding portions 20A of the metal layer 20. Referring to 10-4, an encapsulant 13 is formed to cover the die 11 and the bonding wires 14. Each of the bonding wires 14 is not completely covered and thus with a portion exposed from the encapsulant 13. In this embodiment, to make the bonding wires 14 be partially exposed from the encapsulant 13, the encapsulant 13 may completely cover the die 11 and the bonding wires 14 first, and then an etching step is applied to remove a surface of the encapsulant 13 until the bonding wires 14 are partially exposed.

Referring to FIG. 10-5, the carrier plate 80 is removed, and an etching step is performed on the metal layer 20 in FIG. 10-4 to form a patterned conductive layer 40. The patterned conductive layer 40 includes a plurality of conductive traces 41' and a plurality of conductive pads 21' formed from the protruding portions 20A. The conductive traces 41' are correspondingly connected to the bond pads 121A on the active surface 121 of the die 11 and the conductive pads 21' respectively. In another embodiment, after the carrier plate 80 is removed, the aforementioned etching step may etch away the metal layer 20 in FIG. 10-4 until only the conductive pads 21' formed from the protruding portions 20A are left. Then, a plurality of conductive traces 41' is formed by, for example, electroplating to correspondingly connect the bond pads 121A on the active surface 121 of the die 11 and the conductive pads 21' respectively.

Referring to FIG. 10-6, the first external connection terminals 16 are formed on the encapsulant 13, and electrically connected to the portions of the bonding wires 14 exposed from the encapsulant 13 respectively. In this embodiment, the first external connection terminals 16 may be solder balls, and this step may be a ball planting step with a ball planting method selected from but not limited to, for example, screen printing, vapor deposition, electroplating, ball drop, and ball spraying. Furthermore, in this embodiment, a plurality of second external connection terminals 31 electrically connected to the conductive traces 41' respectively may be formed optionally.

Figure 11A:
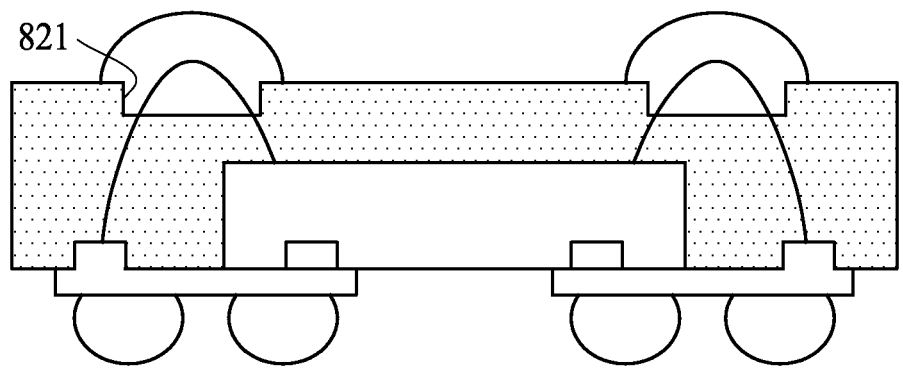
FIG. 11A and FIG. 11B show two semiconductor package structures according to two embodiments of the present invention.
Figure 11B:
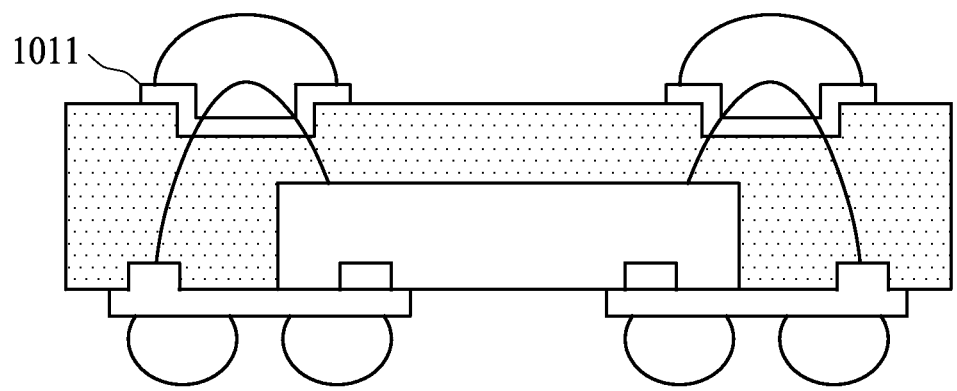

FIG. 11A and FIG. 11B show two semiconductor package structures according to another embodiments of the present invention. Compared with FIG. 10-6, FIG. 11A further includes a step of forming at least one recessed structure 821 on an upper surface of the encapsulant 13. The recessed structure 821 corresponds to the portions of the bonding wires 14 exposed from the encapsulant 13, and is used to accommodate the first external connection terminals 16, thereby facilitating the positioning and the attachment of the first external connection terminals 16. The recessed structure 821 may be formed through an etching step, which is, but not limited to, for example an etching step using a carbon dioxide laser. Since the carbon dioxide laser only removes the encapsulant, but does not remove metal, the etching step can ensure that the metal bonding wires 14 are not damaged. Compared with FIG. 11A, FIG. 11B further includes forming a UBM 1011 in the recessed structure 821. The UBM 1011 is located between the first external connection terminals 16 and the upper surface of the encapsulant 13, so as to reinforce the bonding between the first external connection terminals 16 and the encapsulant 13. Furthermore, the UBM 1011 of metal material being formed on the upper surface of the encapsulant 13 makes the upper and lower surfaces of the encapsulant 13 both overlaid by the metal structures, thereby alleviating the warpage problem of the package structure.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package structure, comprising:
a die, comprising an active surface and a back surface opposite to the active surface;
a plurality of bonding wires, wherein a first end of each of the bonding wires is connected to the back surface of the die, and a second end opposite to the first end is electrically connected to the active surface;
an encapsulant, covering the back surface of the die and the bonding wires, wherein a portion of each of the bonding wires is exposed from the encapsulant; and
a plurality of first external connection terminals, disposed on the encapsulant, respectively covering the portions of the bonding wires exposed from the encapsulant, and being electrically connected to the bonding wires.

2. The structure according to claim 1, further comprising a patterned conductive layer electrically connecting the second ends of the bonding wires and the active surface.

3. The structure according to claim 2, further comprising a plurality of second external connection terminals electrically connected to the patterned conductive layer.

4. The structure according to claim 2, wherein the patterned conductive layer further comprises a plurality of conductive traces electrically connected to the second ends of the bonding wires and the active surface respectively, and the number of the bonding wire electrically connected to one of the conductive traces is greater than or equal to one.

5. The structure according to claim 4, wherein the patterned conductive layer further comprises a plurality of conductive pads, and the conductive pads are disposed on the conductive traces and connected to the second ends of the bonding wires respectively.

6. The structure according to claim 1, further comprising at least one recessed structure formed in the encapsulant to accommodate the first external connection terminals.

7. The structure according to claim 6, further comprising an under bump metallization (UBM) in the at least one recessed structure, wherein the UBM is located between the first external connection terminals and the encapsulant.

8. A semiconductor stack structure, comprising at least two semiconductor package structures being stacked together, the semiconductor package structure comprising:

a die, comprising an active surface and a back surface opposite to the active surface;

a plurality of bonding wires, wherein a first end of each of the bonding wires is connected to the back surface of the die, and a second end opposite to the first end is electrically connected to the active surface;

an encapsulant, covering the back surface of the die and the bonding wires, wherein a portion of each of the bonding wires is exposed from the encapsulant; and a plurality of first external connection terminals, disposed on the encapsulant, respectively covering the portions of the bonding wires exposed from the encapsulant, and being electrically connected to the bonding wires;

wherein the semiconductor package structures are electrically connected to each other by the first external connection terminals, so as to form the semiconductor stack structure.

9. The stack structure according to claim 8, wherein the semiconductor package structure further comprises a patterned conductive layer electrically connecting the second ends of the bonding wires and the active surface.

10. The stack structure according to claim 9, wherein the semiconductor package structure further comprises a plurality of second external connection terminals electrically connected to the patterned conductive layer.

11. The stack structure according to claim 9, wherein the patterned conductive layer further comprises a plurality of conductive traces electrically connected to the second ends of the bonding wires and the active surface respectively, and the number of the bonding wire electrically connected to one of the conductive traces is greater than or equal to one.

12. The stack structure according to claim 8, wherein the semiconductor package structure further comprises at least one recessed structure formed in the encapsulant to accommodate the first external connection terminals.

13. The stack structure according to claim 12, wherein the semiconductor package structure further comprises an under bump metallization (UBM) in the at least one recessed structure, wherein the UBM is located between the first external connection terminals and the encapsulant.

* * * * *